United States Patent
Miyoshi

(10) Patent No.: US 6,462,362 B1
(45) Date of Patent: Oct. 8, 2002

(54) HETEROJUNCTION BIPOLAR TRANSISTOR HAVING PREVENTION LAYER BETWEEN BASE AND EMITTER

(75) Inventor: Yosuke Miyoshi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/711,506

(22) Filed: Nov. 14, 2000

(30) Foreign Application Priority Data

Nov. 15, 1999 (JP) .................................. 11-323920

(51) Int. Cl.[7] ............................................ H01L 21/331
(52) U.S. Cl. ...................................... 257/198; 257/197
(58) Field of Search ............................ 257/183, 197, 257/198

(56) References Cited

U.S. PATENT DOCUMENTS 5,362,657 A * 11/1994 Henderson et al. ............ 437/31
6,355,947 B1 * 3/2002 Niwa ............................ 257/197

FOREIGN PATENT DOCUMENTS

| JP | 3-42841 | * 2/1991 | H01L/21/331 |
|---|---|---|---|
| JP | 5-29336 | 2/1993 | |
| JP | 05-109754 | 4/1993 | |
| JP | 06-037100 | 2/1994 | |
| JP | 6-209007 | * 7/1994 | H01L/21/331 |
| JP | 06-295919 | 10/1994 | |
| JP | 07-037898 | 2/1995 | |
| JP | 07-106343 | 4/1995 | |
| JP | 7-130754 | 5/1995 | |
| JP | 7-263460 | 10/1995 | |
| JP | 7-273125 | * 10/1995 | H01L/21/331 |
| JP | 08-250509 | 9/1996 | |
| JP | 08-288300 | 11/1996 | |
| JP | 9-8055 | 1/1997 | |
| JP | 2770587 | 4/1998 | |
| JP | 10-303214 | 11/1998 | |
| JP | 11-054522 | 2/1999 | |
| JP | 11-87363 | * 3/1999 | H01L/21/331 |
| JP | 11-121462 | * 4/1999 | H01L/21/331 |
| JP | 11-274167 | 10/1999 | |

OTHER PUBLICATIONS

Japanese Office Action dated Feb. 8, 2002, with partial translation.

C. Dubon–Chevallier, "Innovative Passivated Heterojunction Bipolar Transistor Grown By CBE", Electronics Letters, Dec. 3, 1992, vol. 28, No. 25, pp. 2308–2309.

C.C. Wu, "High–Performance In0.49Ga0.51P/GaAs Tunneling Emitter Bipolar Transistor Grown by Gas Source Molecular Beam Epitaxy", Extended Abstracts of the 1992 International Conference on Solid State Devices and Materials, Tsukuba, 1992, pp. 316–318.

* cited by examiner

Primary Examiner—Tom Thomas
Assistant Examiner—Ori Nadav
(74) Attorney, Agent, or Firm—McGinn & Gibb, PLLC

(57) ABSTRACT

A bipolar transistor is disclosed, that comprises a collector layer of first conduction type, a base layer of second conduction type, formed on the collector layer, a prevention layer, formed on the base layer, for preventing carriers from being recombined, an emitter layer of first conduction type, formed on a first part of the prevention layer, and a base electrode, formed on a second part separated from the first part of the prevention layer.

19 Claims, 4 Drawing Sheets

1 : SUBSTRATE
2 : SUB-COLLECTOR LAYER
3 : COLLECTOR LAYER
4 : BASE LAYER
5 : PREVENTION LAYER
6 : EMITTER LAYER
7 : EMITTER CONTACT LAYER
10 : COLLECTOR ELECTRODE
11 : BASE ELECTRODE
12 : EMITTER ELECTRODE
20 : GUARD RING
80 : INSULATOR FILM

51: SUBSTRATE
52: SUB-COLLECTOR LAYER
53: COLLECTOR LAYER
54: BASE LAYER
55: EMITTER LAYER
56: EMITTER CONTACT LAYER
60: COLLECTOR ELECTRODE
61: BASE ELECTRODE
62: EMITTER ELECTRODE
63: ALLOYED REGION
70: GUARD RING
80: INSULATOR FILM

51: SUBSTRATE
52: SUB-COLLECTOR LAYER
53: COLLECTOR LAYER
54: BASE LAYER
55: EMITTER LAYER
56: EMITTER CONTACT LAYER
60: COLLECTOR ELECTRODE
61: BASE ELECTRODE
62: EMITTER ELECTRODE
70: GUARD RING

FIG. 3

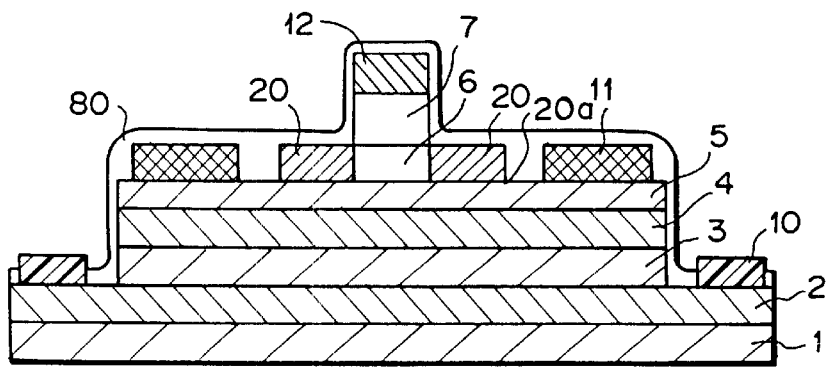

- 1: SUBSTRATE
- 2: SUB-COLLECTOR LAYER
- 3: COLLECTOR LAYER
- 4: BASE LAYER
- 5: PREVENTION LAYER
- 6: EMITTER LAYER
- 7: EMITTER CONTACT LAYER
- 10: COLLECTOR ELECTRODE
- 11: BASE ELECTRODE
- 12: EMITTER ELECTRODE
- 20: GUARD RING
- 80: INSULATOR FILM

FIG. 5

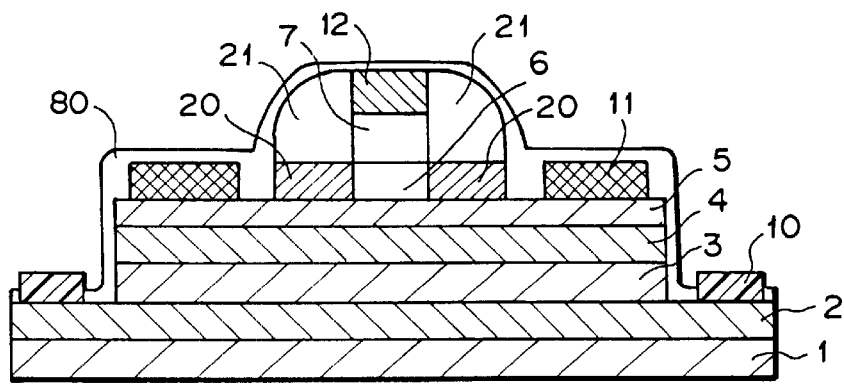

- 1: SUBSTRATE
- 2: SUB-COLLECTOR LAYER
- 3: COLLECTOR LAYER
- 4: BASE LAYER
- 5: PREVENTION LAYER
- 6: EMITTER LAYER
- 7: EMITTER CONTACT LAYER
- 10: COLLECTOR ELECTRODE
- 11: BASE ELECTRODE
- 12: EMITTER ELECTRODE
- 20: GUARD RING
- 21: INSULATION SIDE WALL
- 80: INSULATOR FILM

1: SUBSTRATE
2: SUB-COLLECTOR LAYER
3: COLLECTOR LAYER
4: BASE LAYER
5: PREVENTION LAYER
6: EMITTER LAYER
7: EMITTER CONTACT LAYER
11: BASE ELECTRODE
12: EMITTER ELECTRODE
20: GUARD RING
80: INSULATOR FILM
30, 31, 32: PHOTO RESISTOR

FIG. 6

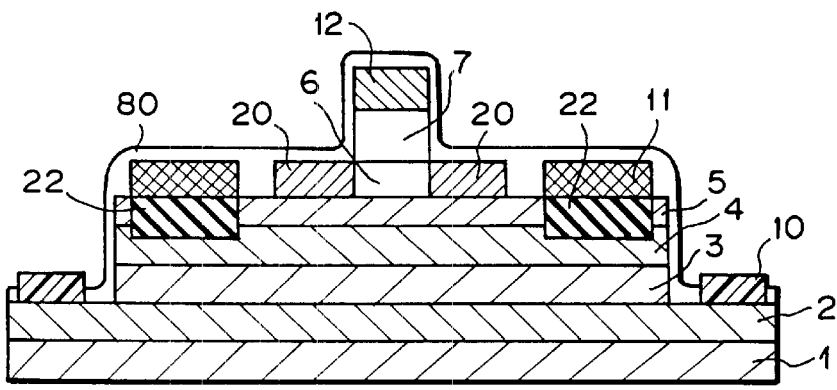

1: SUBSTRATE
2: SUB-COLLECTOR LAYER
3: COLLECTOR LAYER
4: BASE LAYER
5: PREVENTION LAYER
6: EMITTER LAYER
7: EMITTER CONTACT LAYER

10: COLLECTOR ELECTRODE
11: BASE ELECTRODE
12: EMITTER ELECTRODE
20: GUARD RING
22: ALLOYED REGION
80: INSULATOR FILM

FIG. 7

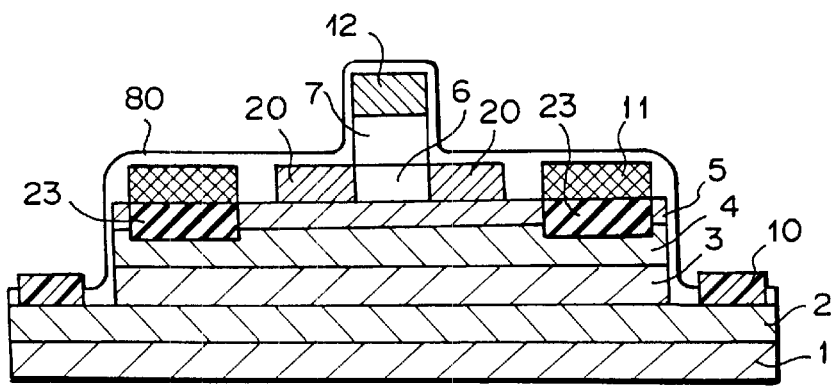

1: SUBSTRATE
2: SUB-COLLECTOR LAYER
3: COLLECTOR LAYER
4: BASE LAYER
5: PREVENTION LAYER
6: EMITTER LAYER
7: EMITTER CONTACT LAYER

10: COLLECTOR ELECTRODE
11: BASE ELECTRODE
12: EMITTER ELECTRODE
20: GUARD RING
23: DIFFUSION REGION
80: INSULATOR FILM

HETEROJUNCTION BIPOLAR TRANSISTOR HAVING PREVENTION LAYER BETWEEN BASE AND EMITTER

BACKGROUND OF THE INVENTION

1. Field of the Invention

The present invention relates to a heterojunction bipolar transistor and a fabricating method thereof, and in particular, to those used for microwave devices (such as mobile telephone units) and optical communication signal processing circuits.

2. Prior Arts

FIG. 1 is a sectional view showing the structure of a heterojunction bipolar transistor (hereinafter referred. to as HBT) disclosed in "Extended Abstracts of the 1992 International Conference on Solid State Devices and Materials, pages 316–318 and "Electronic Letters", Vol. 28, No. 25, pages 2308–2309. As shown in FIG. 1, in the HBT according to the first prior art reference, a sub-collector layer 52 is grown on a substrate 51. A collector layer 53 is grown on the sub-collector layer 52. A base layer 54 is grown on the collector layer 53. A part of the base layer 54 is coated with a very thin emitter layer 55. The thickness of the emitter layer 55 is around 30 nm. An emitter contact layer 56 is grown on the emitter layer 55.

A base electrode 61 is formed on an alloyed region 63. The alloyed region 63 is formed by heat treating the emitter layer 55. The base electrode 61 and the base layer 54 are ohmic contacted through the alloyed region 63. A part of the emitter layer 55 without being covered by the emitter contact layer is depleted and acts as guard-ring. Tile guard-ring 70 is depleted by pinning the Fermi level on front surface of a semiconductor so as prevent carriers from being recombined in the vicinity of the front surface of the base layer 54.

An emitter electrode 62 is formed on the emitter contact layer 56. An insulator film 80 is formed so that the insulator film 80 coats the guard-ring 70, the base electrode 61, the base layer 54, and the sub-collector layer 52.

However, in the HBT shown in FIG. 1, since the thickness of the emitter layer 55 is around 30 nm, even if the alloyed region 63 is formed, the contact resistance between the base layer 54 and the base electrode 61 becomes large. Thus, the high frequency characteristic of the HBT deteriorates.

As a second prior art reference that solves such a disadvantage, an HBT that does not have an alloyed region 63 is disclosed in JPA 10-303214.

FIG. 2 is a sectional view showing the structure of the HBT described in the publication as the second prior art reference. For simplicity, in FIG. 2, similar portions to those in FIG. 1 are denoted by similar reference numerals. In the HBT shown in FIG. 2, a base electrode 61 is formed so that the base electrode 61 contacts to a base layer 54 and a part of a guard-ring 70. Thus, the base electrode 61 and the base layer 54 are contacted without need to use an alloyed region 63. As a result, since the contact resistance between the base layer 54 and the base electrode 61 becomes small, the high frequency characteristic of the HBT can be suppressed from deteriorating.

However, in the HBT shown in FIG. 2, since the base electrode 61 is contacted to the guard-ring 70, when the HBT is driven, the surface potential of the guard-ring 70 varies. Thus, a part of the guard-ring 70 is not depleted, but becomes a neutral region. Consequently, a PN junction between the guard-ring 70 and the base layer 54 causes carriers to be recombined. As a result, since a leak current flows between the base and the emitter of the HBT, the current gain decreases.

On the other hand, when the base electrode 61 is not contacted to the guard-ring 70, carriers are recombined in the vicinity of the front surface of the base layer 54 and an edge portion 70a of the guard-ring 70. As a result, a leak current flows.

SUMMARY OF THE INVENTION

In order to overcome the aforementioned disadvantages, the present invention has been made and accordingly, has an object to provide an HBT and its fabricating method in which a contact resistance between the base layer and the base electrode is small and a leak current between the base and the emitter is suppressed.

According to an aspect of the present invention, there is provided a bipolar transistor, comprising: a collector layer of first conduction type; a base layer of second conduction type, formed on the collector layer; a prevention layer, formed on the base layer, for preventing carrier recombination; an emitter layer of first conduction type, formed on a first part of the prevention layer; and a base electrode, formed on a second part separated from the first part of the prevention layer.

The bipolar transistor may further comprise: a guard ring, formed on an outer periphery of the emitter layer and on the prevention layer.

The bipolar transistor may further comprise: an emitter electrode, formed on the emitter layer.

The bipolar transistor may further comprise: an emitter contact layer, formed between the emitter layer and the emitter electrode.

The bipolar transistor may further comprise: a sub-collector layer of first conduction type, formed below the collector layer.

The bipolar transistor may further comprise: a collector electrode, connected to the sub-collector layer.

The bipolar transistor may further comprise: an insulation side wall, formed on the guard-ring, for defining the size of the guard-ring.

The bipolar transistor may further comprise: an alloyed region, piercing the prevention layer, formed between the base layer and the base electrode.

The bipolar transistor may further comprise: a diffused region, piercing the prevention layer, formed between the base layer and the base electrode.

In the bipolar transistor, the emitter layer may be a III-V group compound semiconductor.

In the bipolar transistor, a V group element of the III-V group compound semiconductor may be phosphorus.

In the bipolar transistor, the III-V group compound semiconductor may be selected from a group consisting of InGaP, InGaAsP, InGaAlP, InGaAlAsP, AlGaP, AlGaAsP, GaP, GaSP, and InP.

In the bipolar transistor, the emitter layer may have a laminate structure.

In the bipolar transistor, the laminate structure may have a sloped-composition layer between two adjacent layers.

In the bipolar transistor, the base layer may be a III-V group compound semiconductor.

In the bipolar transistor, a V group element of the III-V group compound semiconductor may be arsenic.

In the bipolar transistor, the III-V group compound semiconductor may be selected from a group consisting of GaAs, AlGaAs, InGaAs, InGaAs, InAlGaAs, and InAlAs.

In the bipolar transistor, the base layer may have a laminate structure.

In the bipolar transistor, the laminate structure may have a sloped-composition layer between two adjacent layers.

In the bipolar transistor, the prevention layer may be of first conduction type.

In the bipolar transistor, a potential gap of the prevention layer may be larger than a potential gap of the base layer so that the potential gap of the prevention layer functions as a potential barrier for majority carriers of the base layer.

In the bipolar transistor, when the bipolar transistor is driven, a portion of the prevention layer which is not coated with the emitter layer may be fully depleted.

In the bipolar transistor, when the bipolar transistor is driven, a portion of the prevention layer which is not coated with the emitter layer or the guard-ring layer may be fully depleted.

In the bipolar transistor, a potential barrier of the prevention layer for majority carriers of the emitter layer may be 100 meV or less.

In the bipolar transistor, the prevention layer may have a laminate structure.

In the bipolar transistor, the laminate structure may have a sloped-composition layer between two adjacent layers.

In the bipolar transistor, the alloyed region may contain palladium or platinum.

In the bipolar transistor, the diffusion region may be doped with at least one of zinc, beryllium, carbon, magnesium, and manganese.

In the bipolar transistor, the highest portion of the prevention layer may have an etching resistance against an etchant of the emitter layer.

In the bipolar transistor, the highest portion of the base layer may have an etching resistance against an etchant of the prevention layer.

These and other objects, features and advantages of the present invention will become more apparent in light of the following detailed description of the best modes of embodiment thereof, as illustrated in the accompanying drawings.

BRIEF DESCRIPTION OF DRAWINGS

FIG. 3 is a sectional view showing the structure of an HBT according to a first embodiment of the present invention;

FIG. 5 is a sectional view showing the structure of an HBT according to a second embodiment of the present invention;

FIG. 6 is a sectional view showing the structure of an HBT according to a third embodiment of the present invention; and FIG. 7 is a sectional view showing the structure of an HBT according to a fourth embodiment of the present invention.

DESCRIPTION OF PREFERRED EMBODIMENTS

Figure 1:
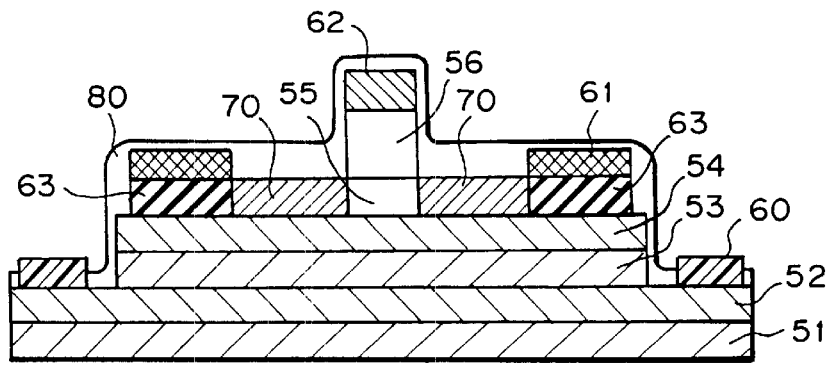
FIG. 1 is a sectional view showing the structure of an HBT according to a first prior art reference.
Figure 2:
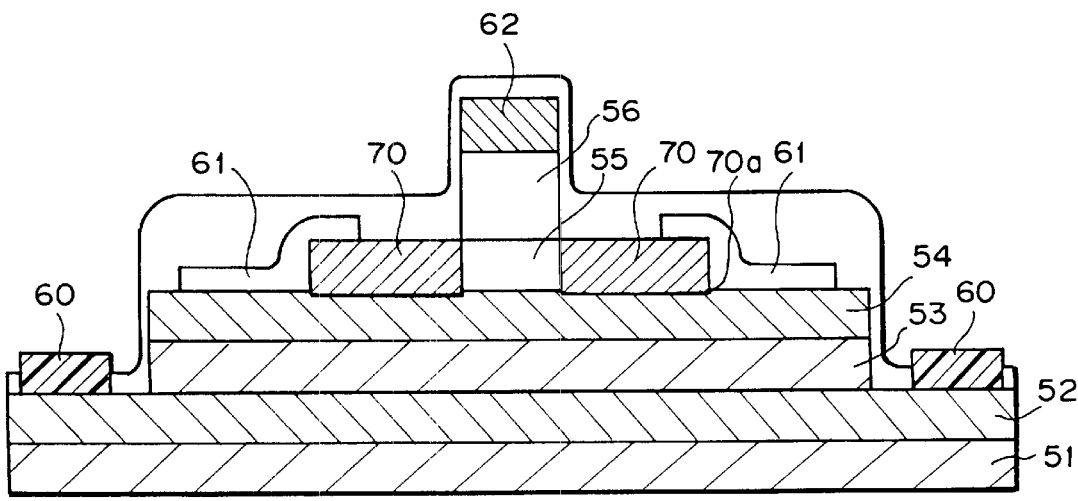
FIG. 2 is a sectional view showing the structure of a modification of the structure shown in FIG. 1 as a second prior art reference.

Next, with reference to the accompanying drawings, embodiments of the present invention will be described.

[First Embodiment]

FIG. 3 is a sectional view showing the structure of an HBT according to a first embodiment of the present invention. The HBT shown in FIG. 3 is an InGaP/GaAs NPN type of HBT. A sub-collector layer 2 is grown on a substrate 1. The sub-collector layer 2 is composed of $n^+$ type of GaAs. The substrate 1 is composed of semi insulating GaAs. A collector layer 3 is grown on the sub-collector layer 2. The collector layer 3 is composed of n type of GaAs.

A base layer 4 is grown on the collector layer 3. The base layer 4 is composed of $p^+$ type of GaAs. A prevention layer 5 is grown as a thin layer having a thickness of, for example, around 5 nm on the base layer 4 so that carriers are not recombined in the vicinity of the front surface of the base layer 4. The prevention layer 5 is composed of n type of InGaAsP.

The prevention layer 5 and the base layer 4 are grown so that the potential gap of the prevention layer 5 is larger than that of the base layer 4. As a result, the potential gap of the prevention layer 5 becomes a potential barrier for majority carriers of the base layer 4. The thickness of the prevention layer 5 is decreased or the doping concentration is decreased corresponding to the thickness of the prevention layer 5 so that at least a part of the prevention layer other than two parts, that is, a first part which is covered with a emitter mesa (composed of the emitter layer 6 and emitter contact layer 7) and a second part which is covered with the guard-ring 20, will be completely depleted in operation.

It is preferred that the potential barrier of the prevention layer 5 for majority carriers of the emitter layer 6 is small. As a permissible value, the potential barrier is 100 meV or less. To do that, the material of the prevention layer is properly selected corresponding to the material of the emitter layer 6.

The emitter layer 6 is grown as a thin layer having the thickness of, for example, around 30 nm on the prevention layer 5. The emitter layer 6 is composed of n type of InGaP. The emitter contact layer 7 is grown on the emitter layer 6. The emitter contact layer 7 is composed of $n^+$ type of GaAs. A base electrode 11 is spaced apart from the emitter mesa composed of the emitter layer 6 and the emitter contact layer 7 by around 500 nm. In addition, the base electrode 11 is directly formed on the prevention layer 5.

The guard-ring 20 is formed around the emitter layer 6 as a depleted portion of the emitter layer 6. The guard-ring 20 is depleted by pinning the Fermi level in front surface of the semiconductor. The guard-ring 20 prevents carriers from being recombined in the vicinity of the front surface of the base layer 4. The thickness of the guard-ring 20 is, for example, around 50 nm.

An emitter electrode 12 is formed on the emitter contact layer 7. In addition, an insulator film 80 is formed so that the insulator film 80 coats the guard-ring 20, the base electrode 11, the base layer 4, and the sub-collector layer 2.

According to the first embodiment of the present invention, carrier recombination due to exposure of the base layer 4 to the insulator film 80 is prevented. In addition, carrier recombination at edge 20a of the guard-ring 20 due to contact of the base layer 4 with the guard-ring 20 is prevented. Thus, a leak current due to such carrier recombinations can be suppressed. Consequently, the current gain does not deteriorate. That is an advantage over the second prior art reference.

In addition, according to the first embodiment of the present invention, since only the prevention layer 5 is interposed between the base layer 4 and the base electrode 11, the contact resistance between the base layer 4 and the base electrode 11 is the same as that in the case they are directly contacted. Thus, the contact resistance can be remarkably decreased in comparison with the first prior art reference.

Consequently, the first embodiment overcomes the disadvantages of the first prior art reference and the second prior art reference.

FIGS. 4A to 4D are sectional views showing the structure of the HBT shown in FIG. 3 at steps of the fabricating method according to the present invention. Next, with reference to FIGS. 4A, 4B, 4C, and 4D, the fabricating method of the HBT shown in FIG. 3 will be described. First, the subcollector layer 2, the collector layer 3, the base layer 4, the prevention layer 5, the emitter layer 6, and the emitter contact layer 7 are successively deposited on the substrate 1.

Those layers are deposited by an epitaxial growth method such as an MOCVD (Metal Organic Chemical Vapor Deposition) method and an MBE (Molecular Beam Epitaxy) method. The thickness of the prevention layer 5 is preferably several nm so as to prevent the contact resistance between the base layer 4 and the base electrode 11 from becoming large.

In order to form the prevention layer 5 as a thin layer, it may be prevented that the prevention layer 5 is directly formed on the base layer 4. Instead, the emitter layer 6 is formed on the base layer 4. They are heat-treated and reacted in the solid phase so as to form the prevention layer 5. The optimum temperature and time necessary for the heat treatment depend on the materials of the base layer 4 and the emitter layer 6. For example, when the emitter layer 6 is composed of n type of InGaP and the base layer 4 is composed of p type of GaAs, the heat treatment is performed in the atmosphere of arsenic at 680° C. for around 10 minutes.

Figure 4A:
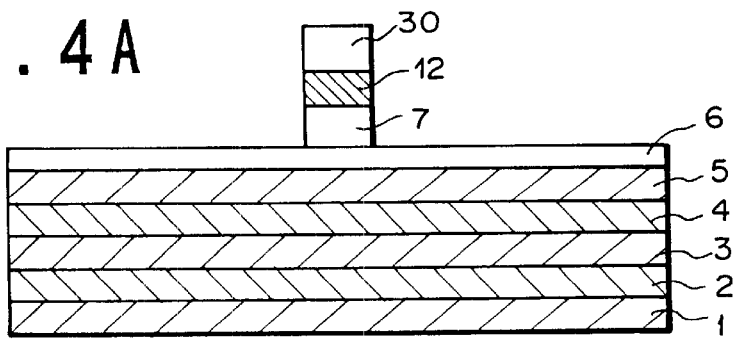
FIGS. 4A to 4D are sectional views showing the structure of the HBT shown in FIG. 3 at steps of a fabricating method according to the present invention.

Thereafter, in order to form the emitter electrode 12, a Ti layer, a Pt layer, and an Au layer (not shown) are successively deposited on the emitter contact layer 7. A predetermined pattern is formed with a photo resist 30 on the Au layer. With the pattern as a mask, unnecessary portions of the Ti layer, the Pt layer, and the Au layer are removed by an ion milling method or the like. As a result, the emitter electrode 12 is formed (as shown in FIG. 4A). Alternatively, as a mask material, an insulation material such as $SiN_x$ or $SiO_2$ may be used instead of the photo resist 30.

After the photo resist 30 is removed, using the emitter electrode 12 as a mask, the emitter contact layer 7 is etched by a reactive ion beam etching (RIBE) method or the wet etching method. If a so-called selective etching method in which the emitter layer 6 has a sufficient etching resistance against an etchant of the emitter contact layer 7 is used when forming the emitter layer 7, the emitter layer 6 can be prevented from being removed.

Figure 4B:
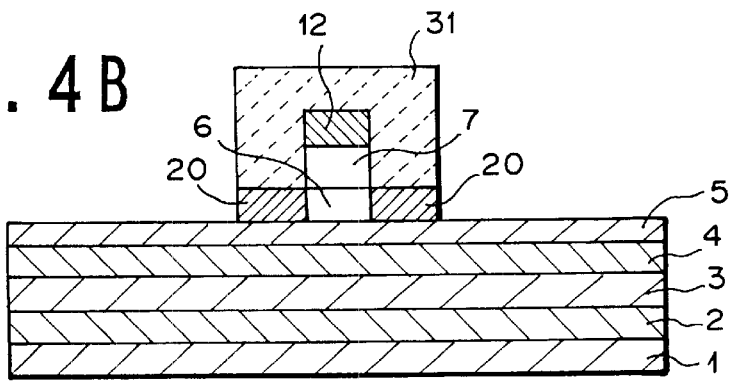

Next, as shown in FIG. 4B, with a mask composed of a photo resist 31, a part of the emitter layer 6 is removed. As a result, the emitter layer 6 is left below and around the emitter electrode 12. The periphery of the lower portion of the emitter electrode 12 functions as a guard-ring 20. It is preferred that the prevention layer 5 has a sufficient etching resistance against an etchant of the emitter layer 6.

Figure 4C:
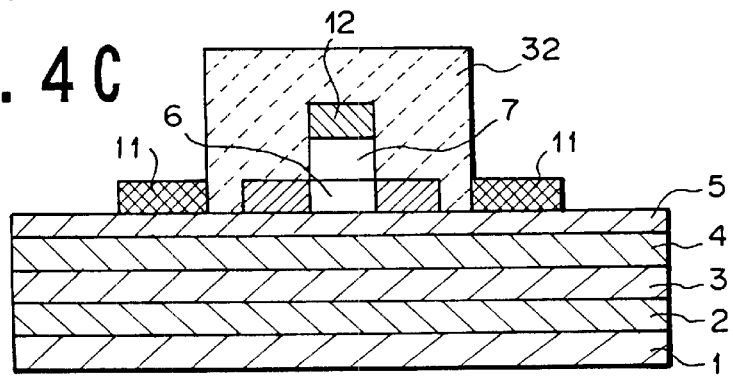

As shown in FIG. 4C, with a photo resist 32, a mask with a pattern having a predetermined open portion is formed. Thereafter, a Pt layer, a Ti layer, a Pt layer, an Au layer, and a Ti layer are successively evaporated on the entire surface of the wafer so as to form the base electrode 11. By a lift off method or the like, the mask and metals evaporated thereon are removed. As a result, the base electrode 11 is formed.

Figure 4D:
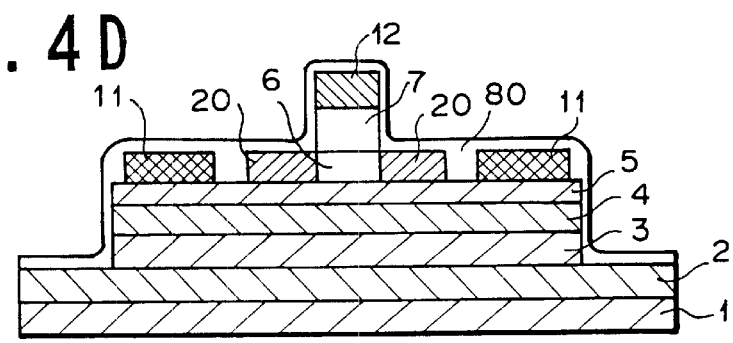

As shown in FIG. 4D, with a photo resist, unnecessary portions of the prevention layer 5, the base layer 4, and the collector layer 3 are etched out. Thereafter, an insulator film 80 is formed so that the insulator film 80 coats the guard-ring 20, the base electrode 11, the base layer 4, and the subcollector layer 2. The insulator film 80 is formed by depositing an $SiO_2$ film having a thickness of around 100 to 200 nm by, for example, a chemical vapor deposition (CVD) method. Thereafter, the collector electrode 10 (as shown in FIG. 3) is formed on the sub-collector layer 2. As a result of the above-described fabricating method, the HBT shown in FIG. 3 is obtained.

According to the present invention, the fabricating method for the HBT shown in FIG. 3 is not limited the steps shown in FIGS. 4A to 4D. For example, in the fabricating method, the step for removing the unnecessary portions of the base layer 4 and the collector layer 3 may be exchanged with the step for forming the base electrode 11.

In addition, the HBT shown in FIG. 3 may be of PNP type of which the conduction type of each layer is inverted. Alternatively, the HBT shown in FIG. 3 may be of InP type. Moreover, the materials of the layers of the HBT are not limited to those described above.

The material of the base layer 4 may be AlGaAs, InGaAs, InAlGaAs, and InAlAs as well as GaAs. The base layer 4 may be a laminate composed of these materials. In the laminate structure, a sloped-composition layer may be interposed between two adjacent layers.

The material of the prevention layer 5 may be InGaAlAsP, AlGaAsP, GaAsP, AlAsP, and InAsP as well as InGaAsP. Alternatively, the prevention layer 5 may be a laminate composed of those materials. In the laminate structure, a sloped-composition layer may be interposed between two adjacent layers.

The material of the prevention layer 6 may be InGaAsP, InGaAlP, InGaAlAsP, AlGaP, AlGaP, AlGaAsP, GaP, GaAsP, and InP as well as InGaP. Alternatively, the emitter layer 6 may be a laminate composed of those materials. In the laminate structure, a sloped-composition layer may be interposed between two adjacent layers.

In other words, as long as the prevention layer 5 is formed along with the emitter layer 6 and the base layer 4 by an epitaxial growth method or the like, in any combination of those materials of the those layers, a desired effect can be obtained.

However, in case the base layer 4 and the emitter layer 6 are heat-treated to form the prevention layer 5 after the emitter layer 6 has been formed on the base layer 4, the material of the prevention layer 5 contains the materials of the base layer 4 and the emitter layer 6.

[Second Embodiment]

FIG. 5 is a sectional view showing the structure of an HBT according to a second embodiment of the present invention. The HBT shown in FIG. 5 is different from the HBT shown in FIG. 4 in that an insulation side wall 21 having a thickness of around 100 to 300 nm is formed on a guard-ring 20 using the emitter contact layer 7 as a reference.

The insulation side wall 21 is used as an etching mask when forming the guard-ring 20. After an emitter mesa is formed, an insulation layer is grown on the entire surface of the wafer. Thereafter, the insulation layer is anisotropically etched by a reactive ion etching (RIE) method or the like to form the insulation side wall. The other layer structure and the fabricating steps of the HBT according to the second embodiment are the same as those according to the first embodiment. For simplicity, in FIG. 5, similar portion to those in FIG. 3 are denoted by similar reference numerals.

According to the first embodiment, when the mask is misaligned, the length of a part of the guard-ring 20 may become short. In the short portion, carriers may be recombined. In contrast, according to the second embodiment, since the length of the guard-ring 20 does not vary, such a problem does not take place.

[Third Embodiment]

FIG. 6 is a sectional view showing the structure of an HBT according to a third embodiment of the present invention. The structure of the HBT shown in FIG. 6 is the same as the structure of the HBT shown in FIG. 3 except that the former further contains an alloyed region 22 that electrically connects a base electrode 11 and a base layer 4. The alloyed region 22 may contain palladium or platinum.

For example, the alloyed region 22 is formed by heat-treating a base electrode 11 so as to alloy the lowest layer (Pt layer) of the base electrode 11 and a prevention layer 5. Thus, the contact resistance between the base electrode 11 and the base layer 4 becomes small.

[Fourth Embodiment]

FIG. 7 is a sectional view showing the structure of an HBT according to a fourth embodiment of the present invention. The structure of the HBT shown in FIG. 7 is the same as the structure of the HBT shown in FIG. 3 except that the former further contains a diffusion region 23 with the same conduction type as a base layer 4. The diffusion region 23 is doped with at least one of zinc, beryllium, carbon, magnesium, and manganese.

The diffusion region 23 is formed by selectively doping ions to a portion at which the base electrode 11 is formed on the prevention layer 5 using a mask or the like or by heat-treating a substance containing diffused ions such as ZnO so as to diffuse Zn. Thus, the contact resistance between the base electrode 11 and the base layer 4 becomes small.

Although the present invention has been shown and described with respect to the best modes of embodiment thereof, it should be understood by those skilled in the art that the foregoing and various other changes, omissions, and additions in the form and detail thereof may be made therein without departing from the spirit and scope of the present invention.

What is claimed is:

1. A heterojunction bipolar transistor, comprising:
    a base layer of a first compound semiconductor;
    a prevention layer formed on said base layer;
    an emitter layer of a second compound semiconductor, formed on said prevention layer;
    a guard ring formed on said prevention layer so that said guard ring surrounds said emitter layer; and
    a base electrode formed on said prevention and apart from said guard ring,
    wherein a band gap of said prevention layer is larger than a band gap of said base layer.

2. The heterojunction bipolar type transistor as set forth in claim 1, wherein a potential barrier of said prevention layer for majority carriers of said emitter layer is 100 meV or less.

3. The heterojunction bipolar type transistor as set forth in claim 1, wherein said base layer comprises a III-V group compound semiconductor including arsenic as a V group element, and wherein said emitter layer comprises a III-V group compound semiconductor including phosphorus as a V group element.

4. The heterojunction bipolar type transistor as set forth in claim 3, wherein said III-V group compound semiconductor including, arsenic as a V group element is selected from the group consisting of GaAs, AlGaAs, InGaAs, InGaAs, InAlGaAs and InAlAs.

5. The heterojunction bipolar type transistor as set forth in claim 4, wherein said base layer has a laminate structure.

6. The heterojunction bipolar type transistor as set forth in claim 5, wherein said laminate structure has a sloped-composition layer between two adjacent layers, said sloped composition layer having a change in a ratio of components in a direction toward said adjacent layers.

7. The heterojunction bipolar type transistor as set forth in claim 3, wherein said III-V group compound semiconductor including phosphorus as a V group element is selected from the group consisting of InGaP, InGaAsP, InGaAlP, InGaAlAsP, AlGaP, AlGaAsP, GaP, GaAsP and InP.

8. The heterojunction bipolar type transistor as set forth in claim 7, wherein said emitter layer has a laminate structure.

9. The heterojunction bipolar type transistor as set forth in claim 8, wherein said laminate structure has a sloped-composition layer between two adjacent layers, said sloped composition layer having a change in a ratio of components in a direction toward said adjacent layers.

10. The heterojunction bipolar type transistor as set forth in claim 1, wherein said prevention layer comprises as element selected from a group consisting of InGaAsP, InGaAlAsP, AlGaAsP, GaAsP, AlAsP and InAsP.

11. The heterojunction bipolar type transistor as set forth in claim 10, wherein said prevention layer has a laminate structure.

12. The heterojunction bipolar type transistor as set forth in claim 11, wherein said laminate structure has a sloped-composition layer between two adjacent layers, said sloped composition layer having a change in a ratio of components in a direction toward said adjacent layers.

13. The heterojunction bipolar type transistor as set forth in claim 1, wherein a joint surface of said prevention layer with said emitter layer has an etching resistance against an etchant of said emitter layer.

14. The heterojunction bipolar type transistor as set forth in claim 1, wherein a joint surface of said base layer with said prevention layer has an etching resistance against an etchant of said prevention layer.

15. The heterojunction bipolar type transistor as set forth in claim 1, further comprising:
    a base electrode which is ohmic contacted with said base layer,
    wherein a region of said prevention layer where said base electrode is ohmic contacted with said base layer contains and alloyed with palladium or platinum.

16. The heterojunction bipolar type transistor as set forth in claim 1, further comprising:
    a base electrode which is ohmic contacted with said base layer,
    wherein a region of said prevention layer where said base electrode is ohmic contacted with said base layer is doped with at least an element selected from a group consisting of zinc, beryllium, carbon, magnesium and manganese.

17. A heterojunction bipolar type transistor, comprising:
    a substrate;
    a sub-collector layer formed on said substrate;
    a collector layer formed on said sub-collector layer;
    a base layer formed on said collector layer;
    a prevention layer formed on said base layer; emitter layer formed on said prevention layer;
    a guard ring formed on said prevention layer so that said guard ring surrounds said emitter layer, and
    a base electrode formed on said prevention layer and apart from said guard ring, wherein a band gap of said prevention layer is larger than a band gap of said base layer.

18. The heterojunction bipolar type transistor as set forth in claim 17, wherein a potential barrier of said prevention layer for majority carriers of said emitter layer is 100 meV or less.

19. The heterojunction bipolar type transistor as set forth in claim 17, wherein said prevention layer has an etching resistance against an etchant of said emitter layer.

* * * * *